United States Patent
Ingram et al.

(10) Patent No.: US 6,344,777 B1
(45) Date of Patent: Feb. 5, 2002

(54) HIGHLY EFFICIENT COMPACT ULTRA-HIGH POWER SOURCE

(75) Inventors: Daisy L. Ingram, Cerritos; Yaochung Chen, Rancho Palos Verdes; William M. Brunner, Harbor City; Huan-Chun Yen, Torrance, all of CA (US)

(73) Assignee: TRW Inc., Redondo Beach, CA (US)

(*) Notice: Subject to any disclaimer, the term of this patent is extended or adjusted under 35 U.S.C. 154(b) by 3 days.

(21) Appl. No.: 09/618,391

(22) Filed: Jul. 18, 2000

(51) Int. Cl.⁷ .................................................. H03F 3/68
(52) U.S. Cl. ........................................ 330/295; 330/286
(58) Field of Search .......................... 330/295, 174 R, 330/286; 333/125, 137

(56) References Cited

U.S. PATENT DOCUMENTS

| | | | | |
|---|---|---|---|---|
| 2,497,854 A | * | 2/1950 | Baller | ........................ 250/36 |
| 2,801,391 A | * | 7/1957 | Whitehead | ................... 333/11 |
| 4,673,899 A | * | 6/1987 | Jespersen et al. | ........... 333/137 |
| 5,838,201 A | * | 11/1998 | Sechi | ......................... 330/286 |
| 6,242,984 B1 | * | 6/2001 | Stones et al. | ............... 330/295 |

* cited by examiner

Primary Examiner—Robert Pascal
Assistant Examiner—Henry Choe
(74) Attorney, Agent, or Firm—Ronald M. Goldman (57) ABSTRACT

Greater levels of microwave and millimeter microwave frequency power is achieved in a new power amplifier structure in which sixteen MMIC amplifiers are supported in a 4×4 row by column matrix and the output (and input) manifold is of a "crazy-H" power combining structure. Even greater output power, on the order of 100 watts at 35 GHz, is achieved by combining multiple numbers of such power amplifier units through a radial combiner.

6 Claims, 5 Drawing Sheets

HIGHLY EFFICIENT COMPACT ULTRA-HIGH POWER SOURCE

FIELD OF THE INVENTION

This invention relates to high power microwave and millimeter wave RF sources, and, more particularly, to a high power RF amplifier structure that combines the RF power output of a large number of individual semiconductor millimeter wave RF amplifiers to achieve higher power levels within a physically compact package.

BACKGROUND

The microwave and millimeter wave (MMW) frequency range has long been the range of choice for various electronic devices, such as radar, satellite up-link and down-link transmitters, LMDS ground station transmitters and smart munitions. To achieve RF at frequencies in that range, as example, at 35 GHz, millimeter microwave integrated circuit ("MMIC") devices have been developed to produce and/or amplify RF signals with reasonable levels of efficiency. Many of those MMIC devices employ high electron mobility transistors ("HEMT") as the active element providing amplification. One example of such a high efficiency MMIC source is described in an article by Ingram et. al. (a co-inventor) appearing in the IEEE Transactions on Microwave Theory and Techniques, Vol. 45, No. 12, December 1997 at pages 2424–2430.

Although the MMIC amplifier described in the foregoing article achieved a benchmark in power level in the achievement of a six watt RF output, due to the nature of the semiconductor device and the high frequency, the high power achieved by a single such MMIC amplifier device is much less than the power levels which are achieved at the lower microwave frequencies at which the familiar magnetron or klystron devices are used. Although the RF power is relatively high for a semiconductor device at the 35 GHz frequency, that power is less than customarily desired for the typical radar and/or up link and down link communications channels. It may be said that the more power available, the better. To achieve greater RF power levels at millimeter wave frequencies, it has been necessary to combine the RF outputs of multiple numbers of MMIC amplifier devices so that the total output power from the combination is much larger than that available solely from a single MMIC amplifier.

The familiar binary combiner has typically been used for that RF combining function in those plural MMIC power amplifier combinations. In implementation of the binary combiner, RF inputted from separate sources to a pair of waveguide arms are combined by use of a Magic-T junction, and the combined output is then introduced by a third port of the Magic-T junction to another arm. In turn, the RF in that third arm is then combined by another Magic-T junction with the RF output of another like waveguide arm that introduces the combined power from a different pair of arms. The combining structure must be symmetrical. That is, each arm to a MMIC power amplifier must be of the same length as the corresponding arm associated with any other MMIC power amplifier so that the RF from separate amplifiers is equal in intensity and phase when combined at a Magic-T junction. The foregoing inverted pyramiding structure, at least theoretically, may be built up ad-infinitum to produce very high power levels.

In practice, power loss is inherent in the binary combiner structure due to the waveguide media, such as the air environment within the waveguide, resistivity of the waveguide walls and imperfection of the construction. Some portion of the RF energy heats the air and the waveguide, and is essentially lost as heat, reducing the energy that is output. That power loss serves as one limit to the size of the binary combiner and the combination of multiple power amplifiers. As the number of combining elements is increased, the power losses in the arms carrying the higher power levels become excessive, and the combining efficiency drops substantially as the number of stages in the binary combiner increases beyond eight.

A contributing factor to such loss of RF is the physical size of the assembly. Each MMIC amplifier assembly, though small, is of a finite size. To combine the outputs of multiple power amplifiers using the binary combiner technique, the power amplifiers must be arranged, as example, in a single row so as to satisfy the described requirement for symmetry in the binary waveguide combining arrangement. The number of individual power amplifiers may be represented as $2^n$, where n is equal to a whole number greater than 1. Increasing the number of amplifiers from 4 to 8 spreads the row of amplifiers over double the width than before, and, hence, requires an increase in length of the intermediate waveguide arms of the binary combiner that join the amplifiers together. Because the RF must then propagate over greater path lengths, the energy lost due to heating of air in the waveguide and dissipation on the waveguide walls, increases. Hence, the overall electrical efficiency becomes lower.

The physical size of the binary combiner becomes excessively large as the number of included power amplifier elements increase beyond eight. Eventually, the combiner loss increases exponentially beyond between eight to sixteen elements, and additional combining does not produce a net higher power. As an advantage, the present invention allows the RF of a greater number of microwave semiconductors to be combined without incurring such exponentially increasing losses. Considered separately, a large physical size is not typically desirable, since size could pose a problem in applications in which limited space is available, such as in aircraft installations. As a further advantage, the present invention provides both a high power RF amplifier and a more compact physical structure than is available with the existing high power amplifier designs that employ the binary combining structure.

A secondary effect of increased heating is that the MMIC amplifiers, which are sensitive to temperature, are adversely affected by temperature increases. Being a semiconductor material, the lower the temperature of operation, the greater is the power gain achieved. Hence, the amplifier structure typically includes cooling apparatus both active and/or passive types to conduct heat away from the amplifier. Thus, not only do loses increase when the transmission path lengths increase, but the operating efficiency of the individual amplifiers falls off, unless more active cooling can be provided. Even if greater cooling capacity is employed to maintain the amplifier efficiency, the energy expended to provide that cooling instead reduces overall system efficiency.

Accordingly, a principal object of the invention is to provide a new high power RF amplifier this is capable of providing very high power levels at millimeter and microwave frequencies with reasonable efficiency.

Another object of the invention is to provide an efficient means to combine the RF outputs of semiconductor devices to achieve ultra-high power levels in the millimeter/microwave frequency range.

A still further object of the invention is to provide an RF power combining structure whose efficiency and power level surpasses that available in designs that use binary combiners and affords a more compact physical size.

SUMMARY

In accordance with the foregoing objects and advantages, a new waveguide power combining structure is defined by a compact power module that contains numerous (16 will be used as an example to illustrate the concept) MMIC amplifiers and novel manifold structures. The input manifold structure provides an RF feed that evenly distributes inputted RF in equal amplitude and phase to each MMIC amplifier. Each MMIC amplifier amplifies the RF power and the RF output power from each amplifier is combined in the output manifold structure of the power module from which the combined higher power level RF is output.

The individual MMIC power amplifiers are organized in four separate rows and those rows of amplifiers are stacked in layers, one over the other. The input waveguide manifold that distributes the RF to be amplified amongst all the power amplifiers and the output waveguide manifold in which the individual outputs are combined into a single higher power output, are identical to one another, defined waveguides arranged in a pattern of H's, referred to herein as "crazy-H's". In such configuration the input (or output) is located at the center stem of a large English letter "H" shaped waveguide distribution network and the outer arms of the "H" each feed into the center of the connecting stem of a smaller size "H" sub-distribution network. The outer end of each of the outer arms of the small size H distribution network is coupled to the RF input of a respective one of the amplifiers in respect of the input manifold (or to the output of such amplifier in respect of the output manifold) by means of an E-plane transition.

To split a signal into equal parts for distribution to the inputs of various amplifiers each location at which a division is to occur in the input manifold (and each location at which a combination is to occur in the output manifold) includes a Magic-T, as is familiar from the prior binary combiner system. Thus a Magic-T is included at the center stem of each H, both large and small size, and at each juncture between the center stem of the H and the respective arms of the larger size H (and at the output port or input port as the case may be).

The level of combined RF power produced by the foregoing power combining structure, and, hence, the number of MMIC amplifiers incorporated within the structure to amplify RF, is limited by the ability of the structure (and associated cooling devices) to dissipate the heat generated therein by the portion of the RF energy that is consumed in the lossy material. Once that power limit is reached in a given power module design, increased power levels are achieved by combining the RF output of each power module using another arrangement.

As an additional and important aspect to the invention, a plurality of the foregoing power modules are distributed evenly about the periphery of a radial combiner and are respectively coupled in parallel to the inputs of the radial combiner. The output of the radial combiner combines the RF outputs of each power module to produce a power level that is many times greater than the power level output of a single power module. The radial combiner is capable of dissipating greater amounts of heat, since the latter combiner does not contain semiconductor elements. As assembled the combination of power modules and radial combiner provides a symmetrical and compact package.

As a still further aspect to the invention, multiple power module and radial combiner combinations may be assembled into power sources of even greater RF power by stacking the combinations and incorporating a binary waveguide in the vertical direction between the stacked radial combiners.

The foregoing and additional objects and advantages of the invention together with the structure characteristic thereof, which was only briefly summarized in the foregoing passages, will become more apparent to those skilled in the art upon reading the detailed description of a preferred embodiment of the invention, which follows in this specification, taken together with the illustrations thereof presented in the accompanying drawings.

DETAILED DESCRIPTION OF THE PREFERRED EMBODIMENTS

Figure 1:
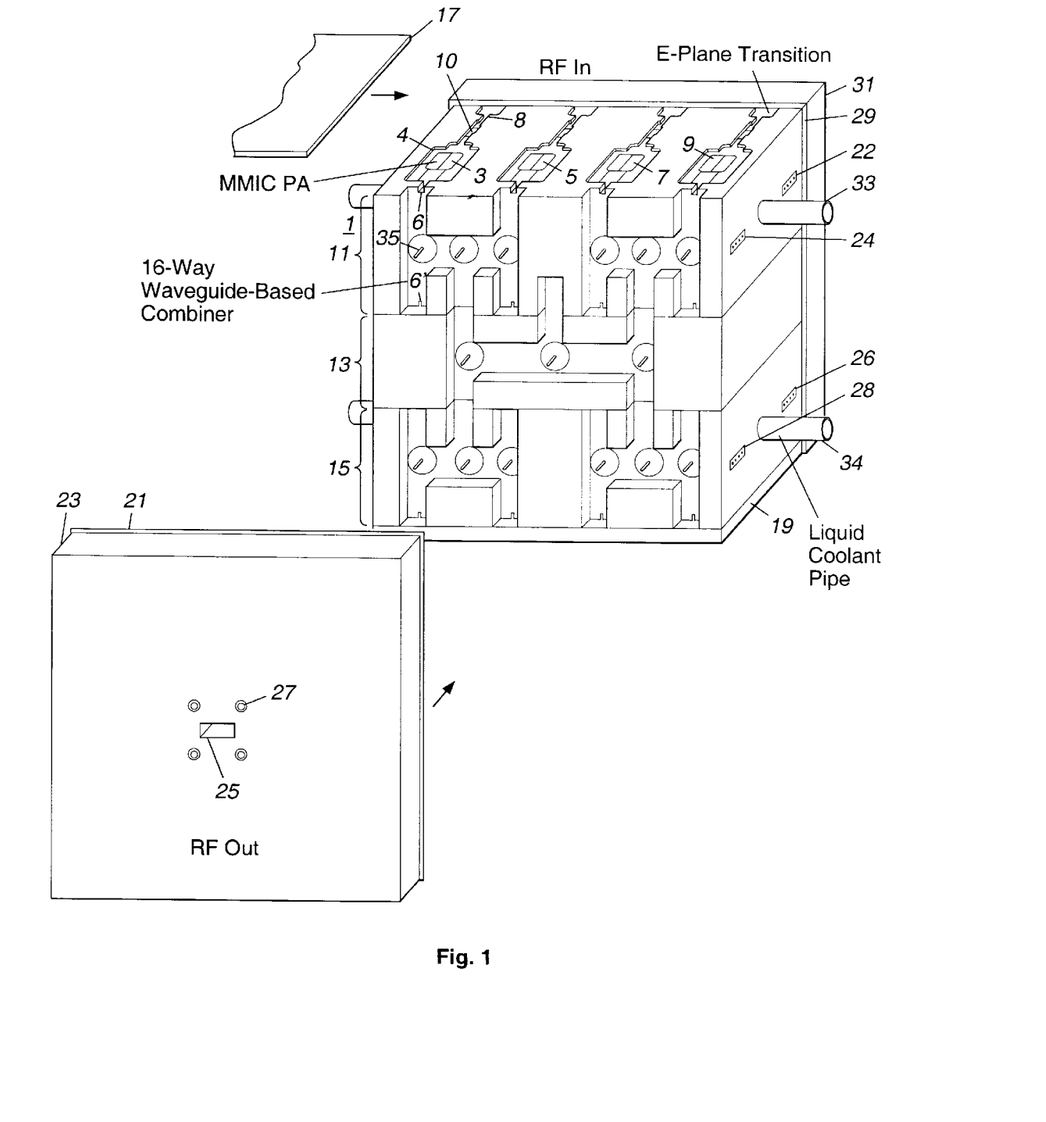
FIG. 1 illustrates an embodiment of the invention in a partially exploded view.

A power amplifier module 1 constructed in accordance with the invention is illustrated in a partially exploded view in FIG. 1 to which reference is made. The module is of a generally rectanguloid or cubic block shape and defines a mechanically compact assembly or package. The power amplifier includes sixteen MMIC power amplifiers in this example, only four of which, 3, 5, 7 and 9, are visible in this view. The principal sections of the assembly are fabricated of shaped thick metal slabs or sections 11, 13 and 15, which are stacked on top of one another to define the main portion of the module. Each member is formed to the shape illustrated in the figure and described more fully herein, suitably by conventional machining techniques. The front surface of the assembly is shaped to define the rectangular passages that form waveguides for the millimeter/microwave RF energy, later herein more fully described. The rear face, not visible in the figure, is identical in shape to the front.

The top side of the amplifier assembly is covered by a metal lid 17, partially illustrated in exploded view, and the bottom is covered by metal panel 19, only the edge of which is visible in the figure. The lid and panel prevent RF leakage from the top and bottom sides of the assembly. The lid also serves as a wall to the small rectangular waveguides defined within sections 11 and 15, such as those associated with MMIC amplifiers 3, 5, 7 and 9. The respective panels are secured in place by conventional set screws that thread into tapped holes in the adjoining section, none of which are illustrated, or, alternatively, may be bonded in place.

Figure 3:
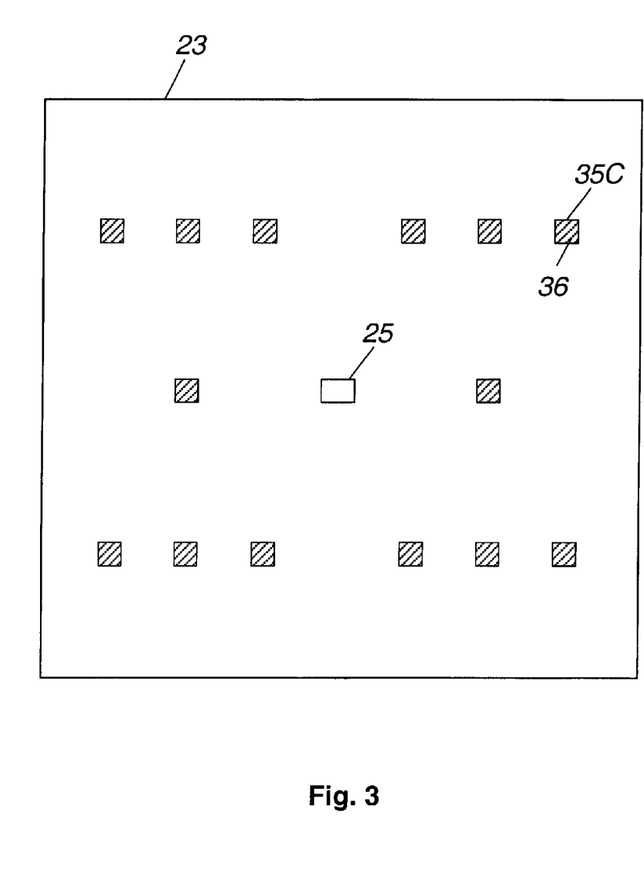
FIG. 3 is a rear view of the front (and rear) panels used in the embodiment of FIG. 1.

The front of the assembly includes a metal layer template panel 21 (described in greater detail in connection with FIG.

3), and a front panel 23, which is of the same area and overlies the former panel. A rectangular passage 25 through front panel 23 (and through panel 21) defines the output waveguide to the power amplifier. An external waveguide connector may be secure to the output waveguide by the four tapped holes 27. The rear surface of the front panel 23 and template panel 21 contain openings and passages, respectively, that electronically function with the elements in the metal slabs 11, 13 and 15 to define the familiar Magic-T junctions, later herein discussed. Together with the formed waveguides in the front face of sections 11, 13 and 15, the panel and template defines the RF output manifold of the power amplifier module. The output manifold provides the RF power combining function, and incorporates the "Crazy-H" waveguide system earlier referred to herein.

The rear of the power amplifier assembly is covered by another metal layer template panel 29, and, overlying that template, and closing the rear side of the assembly, a metal rear panel 31. The rear panel also contains a waveguide passage, not visible, that is identical to passage 25 and is positioned at an identical location in the panel. The rear template 29 and rear panel 31 are identical in structure to front template 21 and front panel 23, and contain the same features. Hence, it should be understood that the further discussion of the front template and panel apply equally to the rear template and panel, and does not require the description of the structure to be repeated.

Likewise, the rear surface of sections 11, 13 and 15 is identical in shape and in features with the shape and features on the front, which are visible in the figure, and define a series of waveguides. Hence, it is not necessary to separately illustrate the rear side of the assembly. Together with the waveguides formed in the rear of sections 11, 13 and 15, rear template 29 and panel 31 defines the RF input manifold. The input manifold serves to divide input RF (to be amplified) equally and in-phase amongst all of the individual MMIC amplifiers in the assembly.

The upper surface of the upper layer contains four individual MMIC power amplifier units or cards 3, 5, 7 and 9, spaced apart in a row in this illustration. Each of those MMIC power amplifiers contains an active semiconductor integrated circuit RF amplifier formed on an insulating substrate and may be of the structure disclosed in the cited article from the IEEE Transactions on Microwave Theory and Techniques. The MMIC amplifiers are contained within a receptacle region formed in the surface, such as receptacle 4. The depth of the receptacle region is sufficient to allow the MMIC device to be recessed from the outer surface.

A second row of four MMIC amplifiers is included on the underside of section 11, not illustrated. The top layer and the second layer of the MMIC power amplifiers are mounted back-to-back with the top layer facing up and the second layer facing down. A third row of four MMIC amplifiers is included on the upper surface of the bottom section 15, which is covered by the middle section 13 and is also not visible in the figure. Lastly, a fourth row of four MMIC amplifiers in included on the under side of bottom section 15, thereby bringing the total of MMIC amplifiers in the power amplifier assembly to sixteen, with the rows stacked over one another. The MMIC amplifiers in each row overlie the corresponding MMIC amplifiers in the lower rows. The foregoing is seen to define a row and column matrix of the individual MMIC amplifiers The structure of each of the MMIC amplifier units in the assembly is identical to every other one as are the passages leading from the front and rear of those units and the receptacles. Thus, only one of those assemblies need be discussed in greater detail. MMIC amplifier 3 is located in receptacle 4.

A small rectangular passage 8 located at the rear end of the assembly, which is the input end to the MMIC power amplifier 3. The passage defines a waveguide for inputting an RF signal that is to be amplified in amplifier 3. It also defines an E-plane transition between the associated waveguide of the RF input manifold and the input waveguide, which, as shown, is oriented orthogonal to the former. The input waveguide couples to a strip transmission line 10 and that transmission line couples RF to the input of the integrated circuit MMIC amplifier 3. The foregoing structure of the MMIC power amplifier is pictorially illustrated and greatly simplified, since such structure is known and the details of that structure are not necessary to the understanding of the invention.

A small rectangular passage or outlet 6 permits the RF output of the individual MMIC amplifier to couple into an end of the waveguide of the power combining manifold at the front that extends orthogonal to passage 6. The outlet passage 6 and waveguide defines a familiar E-plane transition that changes the direction of propagation of the RF and couples the microwave RF for further propagation in the waveguide of the formed output manifold.

The outlet of the MMIC amplifier that underlies MMIC amplifier 3 and corresponds to outlet 6 (and E-plane transition) to one end of the waveguide (or as variously termed waveguide arm) of the power combiner manifold, is located at the opposite end of that vertically extending waveguide and is labeled 6'. The latter is vertically below outlet 6. Both outlets 6 and 6' are equally spaced from the center of the defined passage in the output manifold. The projecting metal stem or tuning rod 35 is located at the midpoint of that rectangular passage. Tuning rod 35 is recognized as a component of the familiar Magic-T junction. The shape and function of the rod is well known to those familiar with the design of Magic-T junctions. Others less familiar with those devices may make reference to the technical literature for additional details. Suitably rod 35 extends from a short conical shaped base that is affixed to the metal surface of the waveguide wall. Other elements of that junction are included in the template 21 and front cover 23, later herein illustrated and further described.

The output to the foregoing Magic-T junction is the short rectangular waveguide that extends horizontally to the right in the figure, perpendicular to the vertical waveguide fed by outlets 6 and 6'. With equal RF applied to each end of the waveguides from outlets 6 and 6', the two axially aligned ports of the Magic-T, the RF introduced by each is combined and propagates from the third waveguide, oriented orthogonal to the former waveguides at the junction, and constitutes the third port of the Magic-T junction.

Figure 2:
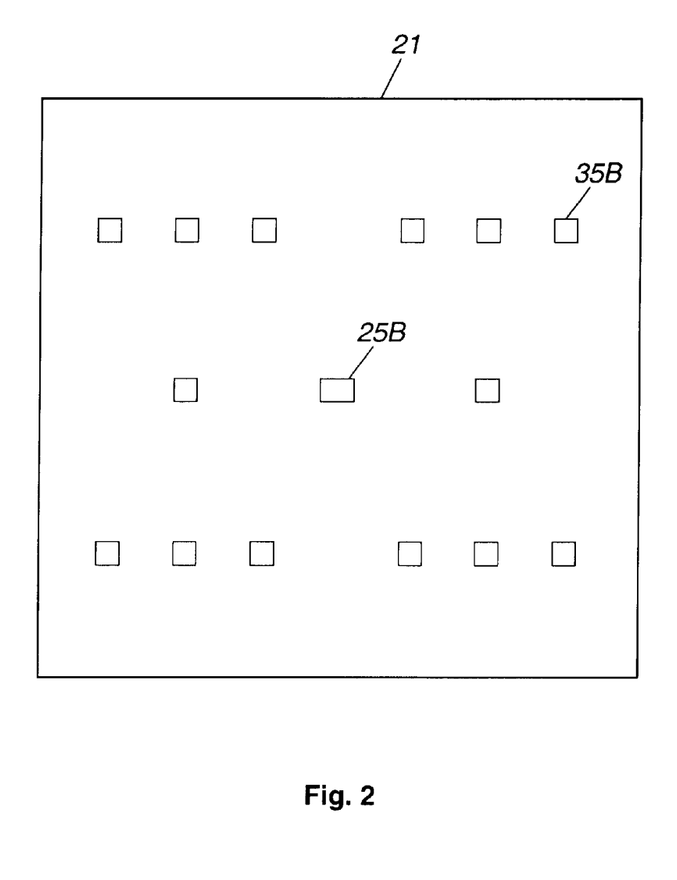
FIG. 2 is a rear view of a panel component of the embodiment of FIG. 1.

As viewed from the rear side, template panel 21 appears as illustrated in FIG. 2 to which reference is made. The template contains a symmetric arrangement of small rectangular passages, symmetrically arranged about a centrally located rectangular passage 25B. The latter passage aligns with the RF output waveguide 25 in the assembly, earlier described in connection with FIG. 1. The small rectangular passages define a short length of rectangular waveguide that provide RF access to RF loss material located in the rear face of the front cover or panel 23. Together the two passages form an element of a Magic-T junction. Passage 35B, as example, overlies tuning rod 35, illustrated in FIG. 1, located at the mid-point between the ends of the formed waveguide connected between outlets 6 and 6'. The tuning rod 35 is symmetrically located in passage 35B.

The rear side of front cover 23 is illustrated in FIG. 3 to which reference is made. The surface includes fourteen small rectangular recesses symmetrically arranged about the central rectangular passage 25, the rear end of the RF output waveguide shown in FIG. 1. Each of the small rectangular recesses is filled with an RF loss material, such as that sold under the brand name ACCOSORB. Recess 35 C accordingly includes loss material 36.

When panel 23 is assembled together with template 21 to the front end of the assembly of FIG. 1, the loss-filled rectangular recesses in panel 23 align with the corresponding fourteen passages in template 21 and, in turn axially align with the axis of the associated one of the fourteen tuning rods, such as 35, projecting from respective sections 11, 13 and 15. Thus recess 35C in cover 23 is aligned with passage 35B in template 21 and with tuning rod 35. As recognized by those skilled in the art each of the foregoing formed waveguides leading to the lossy short circuit at the end of the waveguide found in cover panel 23, is an essential element of the Magic-T and serves as the loss-loaded fourth port. If a slight impedance mismatch occurs in the port, creating reflected RF, ideally the reflected RF is reflected into the fourth port, where that RF is dissipated in the loss material.

Figure 4:
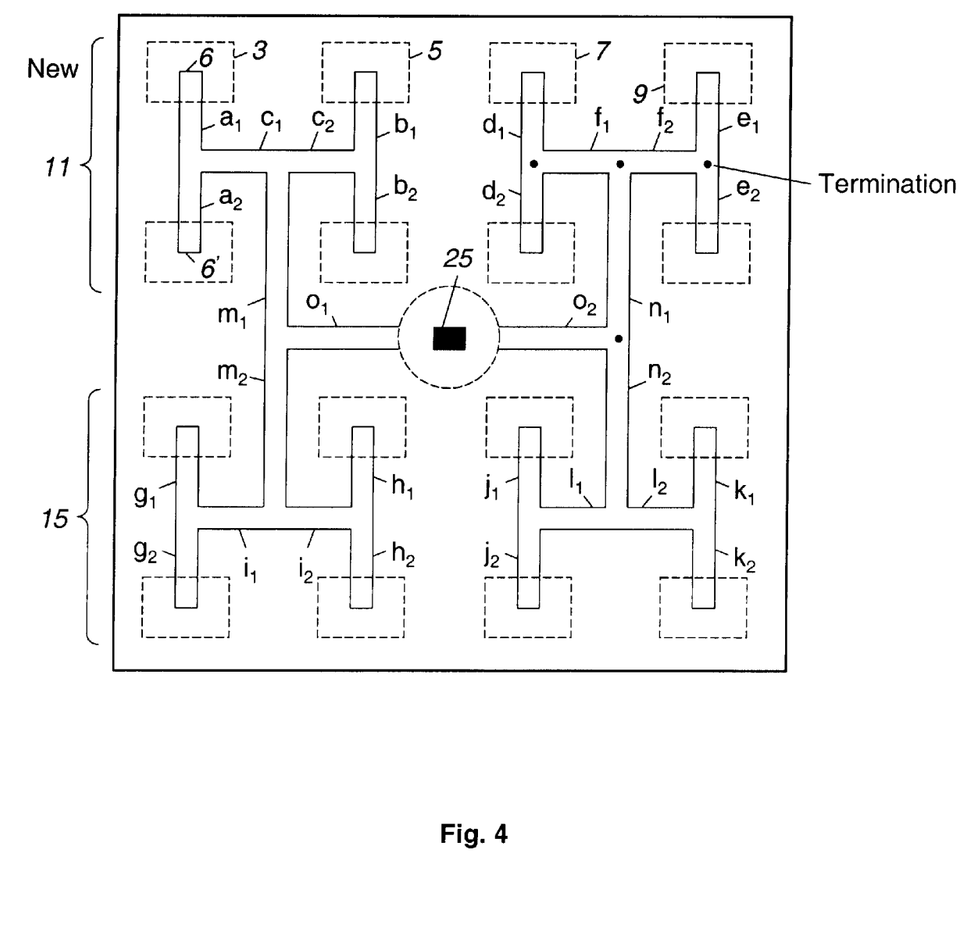
FIG. 4 is a layout of the output and input waveguide manifolds in the embodiment of FIG. 1.

Reference is made to FIG. 4 which better illustrates the layout of the waveguides (and Magic T-junctions) of the manifold at the front side of the power amplifier assembly of FIG. 1, assuming template 21 and front cover 23 are assembled in place to close the outer side of the rectangular waveguides and complete the Magic-T junctions. In this layout, the individual MMIC amplifier units, such as MMIC amplifier 3 are represented by a rectangle formed in dash lines. The outlet ports (or inlet ports in the case of the power splitter input manifold), such as 6 and 6', described in FIG. 1, and the E-plane transition formed therewith are located at the end of each waveguide waveguides. The MMIC power amplifiers are arranged in four layers, two of those layers being located on the top and bottom sides of section 11 and the remaining two layers being located on the respective top and bottom sides of section 15. The MMIC amplifiers in each row are aligned in columns with those individual amplifiers in the underlying row. RF output port 25 is the centrally positioned rectangular waveguide passage.

As illustrated, rectangular waveguides a1 and a2 are coaxially aligned and join at one end, where a Magic-T, not illustrated, is located. Likewise waveguides b1 and b2 are coaxially aligned and are joined at one end, where another Magic-T, not illustrated is located. Waveguide c1 connects the juncture of waveguides a1 and a2 and extends orthogonal thereto to the right in the figure. Waveguide c2 connects the juncture of waveguides b1 and b2 and extends orthogonal thereto to the left in the figure where an end of waveguide c2 joins with an end of waveguide c1, which is aligned therewith. Another Magic-T, not illustrated, is located at the latter juncture. From the latter juncture, a waveguide m1 extends perpendicular to waveguides c1 and c2, vertical in the figure, where it joins with another axially aligned waveguide m2.

As one appreciates the foregoing waveguide arrangement of waveguides a1–c2 resembles the English letter "H" with waveguides c1 and c2 forming the connecting stem and the remaining four waveguides defining the two legs of the letter. An identical waveguide arrangement or layout (including Magic-T junctions, not illustrated) is shown for each of waveguides d1, d2, e1, e2, f1 and f2, which are associated with four additional ones of the individual MMIC amplifiers located in the right side of the two upper rows of the assembly. The juncture of waveguides f1 and f2, at which a Magic-T junction, not illustrated, is located, is joined by waveguide n1, extending vertically downward, perpendicular to the axis of waveguides f1 and f2.

An identical arrangement of four additional waveguides g1, g2, h1, h2, i1 and i2, defining an additional "H" (and the Magic-T junctions, not illustrated) is included for four additional MMIC amplifier units located in the left side of the third and fourth rows of the assembly as depicted in the figure. The mid-point of that juncture is joined with an end of the vertically upward extending waveguide m2, and another Magic-T junction, not illustrated, is located at that juncture. Lastly and identical arrangement of waveguides (and Magic-T junctions, not illustrated) j1, j2, k1, k2, l1 and l2 is provided for the remaining four MMIC amplifiers on the third and fourth columns of the third and fourth rows of the assembly. The juncture of the horizontally extending waveguides l1 and l2 is coupled to a vertically upward extending waveguide n2, oriented perpendicular to the axis of waveguides l1 and l2, and that waveguide connects to an end of waveguide n1.

Waveguides m1 and m2, which are identical in structure, form a juncture at one end with another waveguide o1. The latter waveguide extends perpendicular to the former waveguides and to the right in the figure over to the outlet waveguide 25. Another Magic-T junction, not illustrated, is included at the junction of m1 and m2. Waveguides n1 and n2 on the right in the figure, which are identical in structure and to waveguides m1 and m2, form a juncture at one end with waveguide o2. The latter waveguide is coaxial with waveguide o1 and extends perpendicular to waveguides n1 and n2 and to the left in the figure also over to the outlet waveguide 25. Still another Magic-T junction, not illustrated, is included at the junction of n1 and n2. Another Magic-T junction, not illustrated, is included at the juncture of waveguides o1 and o2 with RF output waveguide 25.

In appearance, waveguides m1, m2, n1, n2, o1 and o2 also resembles the English letter "H", with waveguides o1 and o2 serving as the connecting stem of the letter, and the remaining waveguides as the two outer legs of that letter. This latter "H" is recognized as being larger in size than the "H" configurations earlier described. In this configuration, the end of each leg of the larger "H" is seen to support (or attach) the center stem of a respective one of the smaller sized "H"'s, a configuration, referred to herein as a "crazy H" configuration.

As those skilled in the art recognize, with RF inputs (ideally equal in amplitude and phase) applied to two of the waveguides, such as a1 and a2, the Magic-T combines the signals and outputs the combined signal, ideally 2×in power, on the orthogonal waveguide, waveguide c1. With RF signals propagating along waveguides c1 and c2, the Magic-T at the junction of those waveguides combines and outputs the combined signal, ideally 4×in magnitude, on the orthogonal waveguide m1. And with equal RF signals applied to the ends of o1 and m2, the Magic-T at the junction of those waveguides combines and outputs the combined signal, ideally 8×in magnitude, on the orthogonal waveguide o1. And with equal RF signals applied to the ends of o1 and o2, the Magic-T at the junction of those waveguides combines and outputs the combined signal, ideally 16×in magnitude, on the orthogonal RF output waveguide 25.

Although the layout of FIG. 4 was described in connection with combining of RF power which occurs in the output manifold of the power amplifier assembly, as earlier described, the input manifold is identical. However, in the input manifold application, the RF from an external oscillator is applied to central waveguide port, such as 25, and is evenly distributed amongst all of the individual MMIC amplifier inputs. Each Magic-T junction is reciprocal in electronic characteristic. In that application, each Magic-T junction functions as a power divider or splitter and divides the power between the two arms adjoining the input waveguide. The input is thus divided into sixteen parts and is parceled amongst the sixteen amplifier inputs.

In the preferred embodiment illustrated sixteen MMIC amplifier units are combined. Assuming each amplifier module is capable of delivering ten watts at Ka-band, as example, then the power unit will deliver up to one-hundred watts, with sixty watts being lost.

Referring again to FIG. 1, metal pipes 33 and 34, partially illustrated, extend through passages that extend laterally through sections 11 and 15, respectively. The pipes serve to actively supply liquid coolant from an external source, not illustrated, to conduct away heat generated in the assembly due to the RF losses. The coolant structure is arranged to conduct away heat generated in the devices so as to maintain the junction of the semiconductor MMIC devices cool enough to generate power. Alternatively, heat pipes may be employed instead of coolant.

The cube shaped module arrangement provides a number of advantages. It permits three dimensional component stacking to reduce the overall size. With the active components facing one another on the opposite sides of the coolant block, within which the coolant pipe is embedded, the cooling pipe is shared by the opposing active components reducing the number of coolant pipes that are required to be embedded in the structure. The manifold arrangement keeps all the arm (e.g., in $a_1a_2$, $c_1c_2$, $m_1m_2$, $o_1o_2$ etc.) loss as low as possible while still preserving the equal phase and amplitude characteristics of the conventional binary combiner, which offers good combining efficiency. The entire module may be hermetically sealed.

The MMIC amplifiers are supplied with DC power and a ground connection through connectors 22, 24, 26 and 28 mounted, as example, in a side wall of the assembly. Each of the connectors includes contacts, typically, for three voltages and ground from an external power supply source, not illustrated, which are required to power a typical MMIC amplifier. Through internal passages in the sections of the assembly, not illustrated, insulated electrical leads are threaded into place to appropriate terminals of the respective amplifiers, as is the conventional practice.

Alternatively, four electrical leads may be formed on an elongate bar of insulating material, such as Aluminum Oxide, and short leads are used to connect the respective leads on the bar to the corresponding terminals of the MMIC amplifier in a row and another set of such leads are connected to the associated electrical connector. In such a distribution system, the bar is seated in a laterally extending groove or channel formed in the surfaces of the sections adjacent the input end of the receptacles, extending left to right in the figure. As the electrical connections are not necessary to an understanding of the invention and are conventional in structure, they need not be described in greater detail. Four such power distribution arrangements would be included in the assembly, one for each row of MMIC amplifiers.

As is apparent from the layout of FIG. 4, the waveguide distance between the MMIC power amplifiers and the RF output, that is, the actual physical distance through the waveguides, is shorter than the comparable distance in the prior binary combiner system. In as much as the power loss in transmission through the waveguide is directly related to the length of the waveguide, the combining system used in FIG. 1 is inherently more efficient than the binary system. As a consequence the high power RF amplifier assembly of the present invention is more energy efficient than the power amplifier configuration that incorporates the same number of MMIC power amplifiers and a binary combiner system. With greater combining efficiency, less heat is generated. Hence, for a comparable power amplifier using the binary system, less cooling effort is needed.

One further observes that the high power RF amplifier assembly is very compact and cubic in overall shape, which provides a more space efficient structure than those power amplifiers employing a binary system, wherein the MMIC amplifiers are all placed in a single row, which makes a long narrow structure. The space efficient shape is of particular advantage in embodiments of the invention that provide higher power amplification next herein described Those skilled in the art will realize that the crazy-H manifold structures allows for coupling 4n individual amplifiers together, where n=2, 3, and so forth integers. In this power module, however, sixteen amplifiers (sic n=2) is found to be the optimum number. The next higher number of amplifiers would be sixty-four. In applicant's view it would not be practicable to remove the heat generated in such an enlarged crazy-H system, and a much lower operating efficiency would be obtained, which renders a sixty-four amplifier combination less preferred. Hence in the present invention, the number of amplifiers in power amplifier module is limited to 16. To obtain additional combining and greater RF power output, a number of the power amplifier units of FIG. 1, such as presented in the ultra-high power embodiment presented in FIGS. 5 and 6 to which reference is next made.

Figures 5, 6:
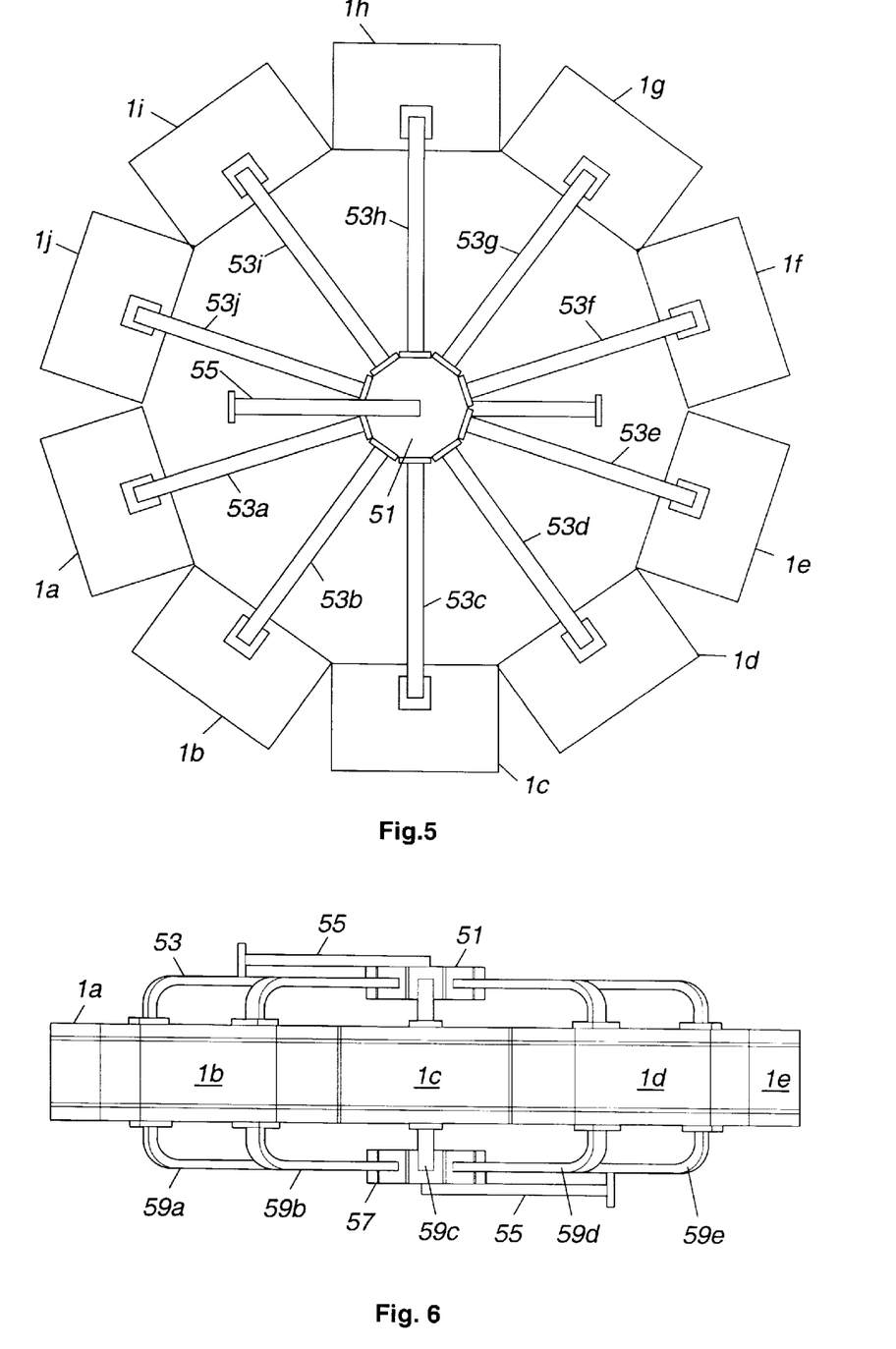
FIG. 5 illustrates in top view another embodiment of the invention, which incorporates the embodiment of FIG. 1.
FIG. 6 illustrates the embodiment of FIG. 5 in side view.

A quantity of the foregoing high power amplifier assemblies of FIG. 1 are combined and used as components of an amplifier power module of even greater power, as depicted in the novel ultra-high power unit illustrated in FIGS. 5 and 6 in top and side view, respectively. In this embodiment, ten high power amplifier assemblies 1a through 1j, constructed in accordance with FIG. 1, are arranged in a circle and a pair of radial combiners 51 and 57 are located at the center of that circle, one above the other as is visible in the side view of FIG. 6. As is conventional, the radial combiners are reciprocal in electrical characteristic and serves as a power splitter when RF is inputted.

The outputs of power modules 1a–1j are connected by a respective one of the rectangular waveguides 53a–53j to a respective one of the ten inputs of the radial combiner. The radial combiner combines the outputs from each of the power units and outputs the combined high power RF through output waveguide 55, where it may be propagated through additional transmission lines to and used by external electronic equipment, not illustrated.

Waveguide 55 serves to supply an input RF signal from an external source, not illustrated, to the centrally located input waveguide of radial power splitter 57. The power splitter divides the inputted signal among the ten output waveguides, only five of which are visible in the side view of FIG. 6, 59a, 59b, 59c, 59d and 59e. The lower input waveguides are obstructed from view in the top view of FIG. 5 by the corresponding output waveguides which are radially aligned with and overlie the corresponding input waveguides.

Reference is made to the side view of the ultra-high power unit presented in FIG. 5. Since each of the individual power units 1a–1j requires input of RF from an external source, not illustrated, the preferred approach is to provide the RF to be amplified from a single source such as an oscillator and divide that RF between the inputs of the various power modules. This requires a power splitter 57 as part of the combination. As shown in FIG. 5, the external RF is coupled to input waveguide 55 which couples that RF to the input of the power splitter 57. The power splitter divides the inputted RF energy equally amongst all of the outputs, which in this embodiment numbers ten equal to the number of power units 1a–1j. Each of the outputs of the power splitter is connected by a respective waveguide 59a to a respective input of the power units 1a–1j.

With each of the high power units supplying some medium RF power on the order of six watts each, the ultra-high power amplifier should supply RF power on the order of ten times that figure, less normal RF losses.

Figure 7:
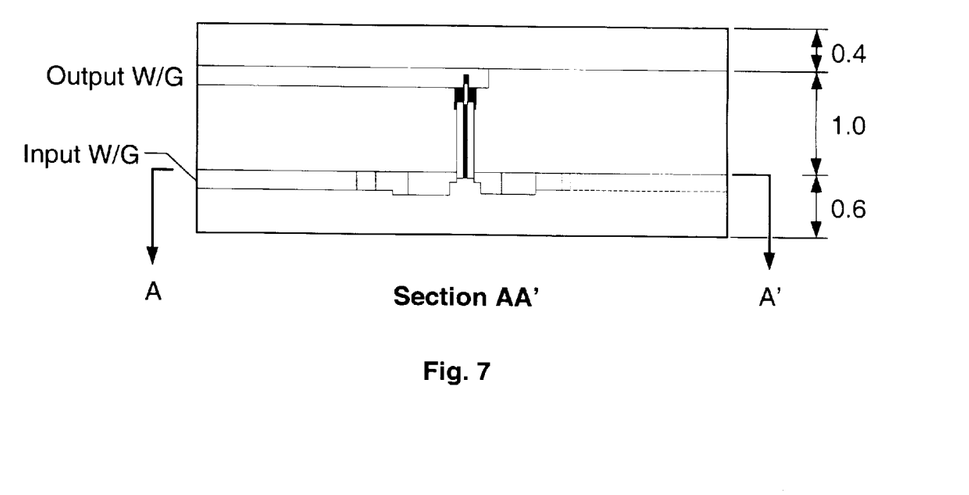
FIG. 7 illustrates in section a radial combiner of the prior art that is used as a component in the embodiment of FIG. 5.
Figure 8:
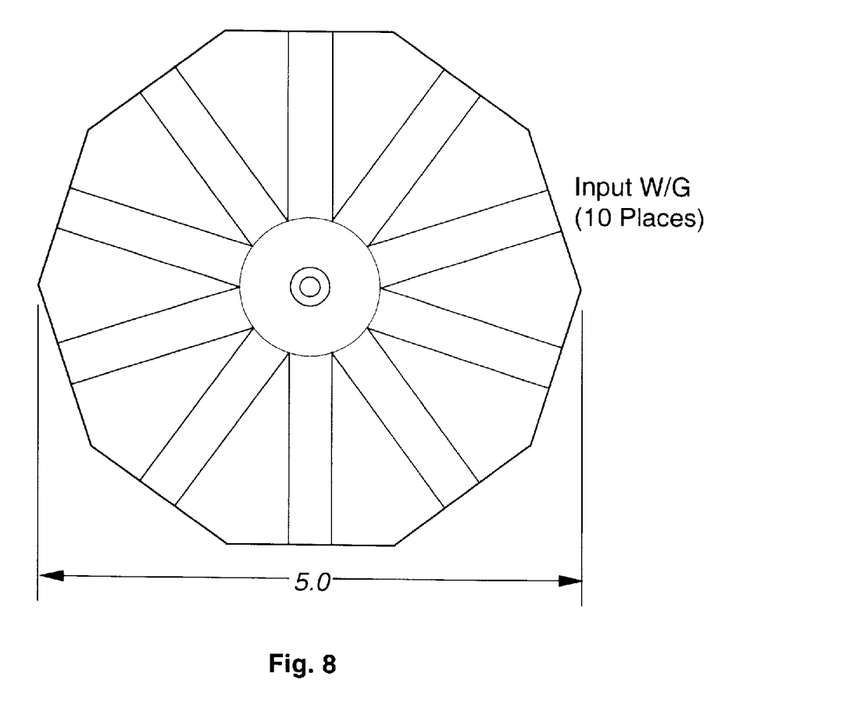
FIG. 8 is a top section view of the radial combiner of FIG. 7 taken along the line A–A'.

Any appropriate radial combiner may be employed for this purpose. An appropriate radial combiner is illustrated in FIGS. 7 and 8 in side section and top section views, respectively. The radial combiner helps to spread the heat over a larger area and, hence, permit a higher level of power combining. The combination of cube shaped power modules and radial combiner interconnection permits a greater number of MMIC chips to be combined without incurring the power losses stemming from feed structures that produce unequal phase and amplitude either at the input or the output of the MMIC circuits.

It is believed that the foregoing description of the preferred embodiments of the invention is sufficient in detail to enable one skilled in the art to make and use the invention. However, it is expressly understood that the detail of the elements presented for the foregoing purpose is not intended to limit the scope of the invention, in as much as equivalents to those elements and other modifications thereof, all of which come within the scope of the invention, will become apparent to those skilled in the art upon reading this specification. Thus, the invention is to be broadly construed within the full scope of the appended claims.

What is claimed is:

1. A source of high power millimeter wave RF, comprising:
   a plurality of MMIC amplifiers, each having an RF input and RF output; said plurality comprising in number sixteen;
   a metal housing;
   said metal housing containing a plurality of metal walled receptacles, each of said receptacles for mounting a respective one of said plurality of MMIC amplifiers; each of said plurality of MMIC amplifiers being seated within a respective one of said plurality of metal walled receptacles;
   said receptacles being organized in rows and columns with four receptacles in each row and in each column, wherein said MMIC amplifiers are arranged in a stack;
   a first manifold having an RF input and a plurality of RF outputs for parsing RF received at said manifold input in equal phase and amplitude for respective distribution to said RF input of each of said MMIC amplifiers;
   a second manifold defining a sixteen way waveguide combiner, said second manifold having a plurality of RF inputs and an RF output for receiving an RF output from each of said plurality of MMIC amplifiers and combining said RF outputs into a single RF output from said RF output of said second manifold;
   said first manifold being located on a first side of said metal housing;
   said second manifold being located on a second side of said metal housing, said second side being opposed to said first side
   each of said receptacles including: a passage for providing an RF transmission path between said first manifold and said respective RF input of said MMIC amplifier, said passage including an E-plane transition and an RF transmission line; and
   each of said receptacles further including: a passage for providing an RF transmission path between said respective RF output of said MMIC amplifier and a respective RF input of said second manifold; whereby the RF provided at said RF output of said second manifold output is a combination of the RF output produced by said plurality of MMIC amplifiers.

2. An ultra-high power source of RF comprising;
   a radial microwave/millimeter wave combiner, said radial combiner having a plurality of waveguide inputs for receiving RF, a waveguide output for outputting RF and means for combining RF received at said inputs into a single output at said waveguide output;
   a plurality of high power RF sources, said plurality being equal in number to said plurality of waveguide inputs to said microwave/millimeter wave combiner, and said plurality of RF sources being distributed about the periphery of said radial microwave combiner;
   a plurality of waveguides, said plurality of waveguides connecting respective ones of said RF outputs of said plurality of high power RF sources to respective waveguide inputs of said radial microwave/millimeter wave combiner;
   each of said high power RF sources comprising:
      a plurality of MMIC amplifiers, each having an RF input and RF output; said plurality comprising in number sixteen;
      a metal housing;
   said metal housing containing a plurality of metal walled receptacles, each of said receptacles for mounting a respective one of said plurality of MMIC amplifiers; each of said plurality of MMIC amplifiers being seated within a respective one of said plurality of metal walled receptacles;
   said receptacles being organized in rows and columns with four receptacles in each row and in each column, wherein said MMIC amplifiers are arranged in a stack;
   a first manifold having an RF input and a plurality of RF outputs for parsing RF received at said manifold input in equal phase and amplitude for respective distribution to said RF input of each of said MMIC amplifiers;
   a second manifold defining a sixteen way waveguide combiner, said second manifold having a plurality of RF inputs and an RF output for receiving an RF output from each of said plurality of MMIC amplifiers and combining said RF outputs into a single RF output from said RF output of said second manifold;
   said first manifold being located on a first side of said metal housing;
   said second manifold being located on a second side of said metal housing, said second side being opposed to said first side
   each of said receptacles including: a passage for providing an RF transmission path between said first manifold and said respective RF input of said MMIC amplifier, said passage including an E-plane transition and an RF transmission line; and each of said receptacles further including: a passage for providing an RF transmission path between said respective RF output of said MMIC amplifier and a respective RF input of said second manifold; whereby the RF provided at said RF output of said second manifold output is a combination of the RF output produced by said plurality of MMIC amplifiers.

3. A high power microwave/ millimeter wave RF amplifier, comprising:

a metal support for supporting an even numbered plurality of MMIC amplifier modules; said metal support being of a generally rectanguloid shape, including a front wall, a rear wall, and top and bottom walls;

said even numbered plurality of MMIC amplifier modules being grouped into an even numbered plurality of groups of MMIC amplifier modules, each of said groups comprising a spaced lesser even numbered plurality of MMIC amplifier modules laterally spaced from one another; and said respective groups of amplifier modules being positioned at different vertical levels of said metal support;

said metal support further defining a first plurality of waveguide transmission lines, each of said waveguide transmission lines of said first plurality being associated, respectively, with an input of one of said even numbered plurality of MMIC amplifier modules; and wherein one end of each of said first plurality of waveguide transmission lines opens to said rear wall;

said metal support further defining a second plurality of waveguide transmission lines, each of said waveguide transmission lines of said second plurality being associated, respectively, with an output of one of said even numbered plurality of MMIC amplifier modules; and wherein one end of each of said second plurality of waveguide transmission lines opens to said front wall;

a first metal panel for covering said rear wall, said first metal panel containing a microwave port centrally located in said first metal panel for propagating microwave energy from the exterior of said panel to the opposite side of said panel confronting said rear wall of said metal support;

a second metal panel for covering said front wall, said second metal panel containing a microwave port centrally located in said second metal panel for passing microwave energy from the region of said front wall of said metal support to the exterior side of said panel;

said rear wall of said metal support defining a microwave power splitter for evenly dividing microwave energy admitted through said port in said first metal panel amongst each of said first plurality of waveguide transmission lines, whereby microwave energy is applied to each of said MMIC amplifier modules for amplification;

said front wall of said metal support defining a microwave binary power combiner, said microwave binary power combiner for receiving microwave energy from each of said waveguides of said second plurality of waveguides and combining said microwave energy for propagation through said port in said front panel.

4. The invention as defined in claim 3, wherein said microwave binary power combiner further comprises: a plurality of magic-T's.

5. The invention as defined in claim 4, wherein said power splitter includes a plurality of E-plane transitions.

6. A magic-T junction comprising:

a metal assembly having a side wall, and three rectangular channels within the side wall, two of said channels being equal in length and joined at an end to each other, said third channel being formed orthogonal to and opening into said juncture between said first and second channels;

a metal rod located within said channels symmetrically to each of said three channels, said metal rod being attached to the bottom wall of said channel junction and extending orthogonal thereto, said rod extending a predetermined distance from said bottom, said distance being less than the height of said channels, whereby said rod does not extend beyond the outer surface of said side wall;

a metal layer of predetermined thickness, said metal layer; having a rectangular opening therethrough to form a passage between the front and back sides of said layer, said metal layer being positioned on said side wall with said opening overlying said metal rod;

a metal panel, having front and back walls, a rectangular shaped recess in said back wall of said metal panel, said rectangular shaped recess being identical in length and width dimension to said rectangular passage in said metal layer, said recess being positioned on said metal panel in alignment with said rectangular opening in said metal layer;

microwave loss material, said microwave loss material being held within said recess; and means joining said metal layer and said metal panel and said metal assembly in a sandwich assembly.

\* \* \* \* \*